June 10, 1952

P. D. HEATH 2,600,292

FREQUENCY DISCRIMINATOR CIRCUIT

Filed Sept. 25, 1948

Inventor:
Paul D. Heath,
by Merton D. Moore
His Attorney.

Patented June 10, 1952

2,600,292

UNITED STATES PATENT OFFICE 2,600,292

FREQUENCY DISCRIMINATOR CIRCUIT

Paul D. Heath, Syracuse, N. Y., assignor to General Electric Company, a corporation of New York Application September 25, 1948, Serial No. 51,137

7 Claims. (Cl. 250—27)

Figure 1:
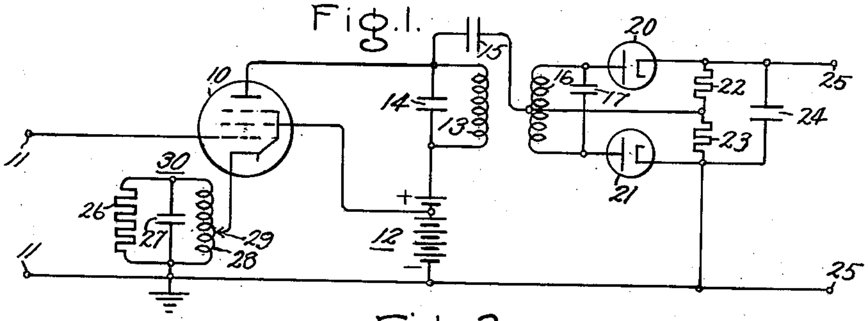

This invention relates to systems for detecting signals of the frequency or phase modulated type and particularly to demodulation circuits employed in conjunction therewith.

In communication systems intended to be used for the reception of frequency modulated waves, it is usually necessary to provide a network which will translate the deviations in frequency of the carrier wave into amplitude modulations of a current to be utilized in reproducing the intelligence conveyed. Such circuits are commonly termed frequency discriminators, and various types are well known in the art. One commonly used frequency discriminator circuit is described in Patent 2,121,103-Seeley, issued June 21, 1938. In such a discriminator circuit, the amplitude modulated current is produced from the frequency modulated wave by means of a transformer comprising primary and secondary circuits, tuned to resonance at the center of the operating range of frequencies, the primary and secondary circuits being related to produce voltages differing in phase by 90° at the center frequency and by lesser or greater angles at other frequencies. The amplitude modulated output is derived therefrom by rectifying these two voltages so as to produce vectorial addition.

In such circuits, it has been found that the range of the response over which the amplitude of the output is linearly proportional to the deviation in frequency of the carrier is limited in the same way as the band width of the transformer, considering the transformer solely as a double-tuned, coupled circuit. The range of linear response as a discriminator can be increased by increasing the mutual coupling between primary and secondary windings. However, in the same way as it is commonly necessary in the case of a tuned transformer to reduce the ratio of reactance to resistance, or Q, of primary and secondary circuits to maintain a flat-topped response over the band, so, in the case of a discriminator, it is similarly necessary to reduce the Q to maintain a linear response over the desired band. Unfortunately, reducing the Q of the tuned circuit decreases the gain and provides a lower output voltage so that such a method of increasing the linear response has severe limitations.

I have found that by inserting in the amplifier a resonant degenerative circuit tuned to the center frequency of the discriminator, I can extend the range of substantially linear response by a considerable amount with considerably less reduction of gain than would occur if the same widening were obtained by decreasing the Q of the tuned circuits.

It is an object of this invention to provide a new and improved discriminator circuit with a wider frequency response than heretofore possible for the same gain in the stage.

Another object of this invention is to provide an amplifier circuit for detecting frequency modulated waves comprising a degenerative circuit for increasing the range of frequencies wherein the response provides an amplitude modulated output linearly proportional to the deviation of the carrier from its center frequency.

For additional objects and advantages and for a better understanding of the invention, attention is now directed to the following description and accompanying drawings, and also to the appended claims in which the features of the invention believed to be novel are particularly pointed out.

Figure 2:
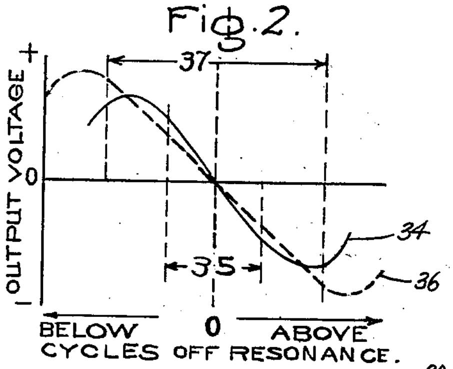
Figure 3:
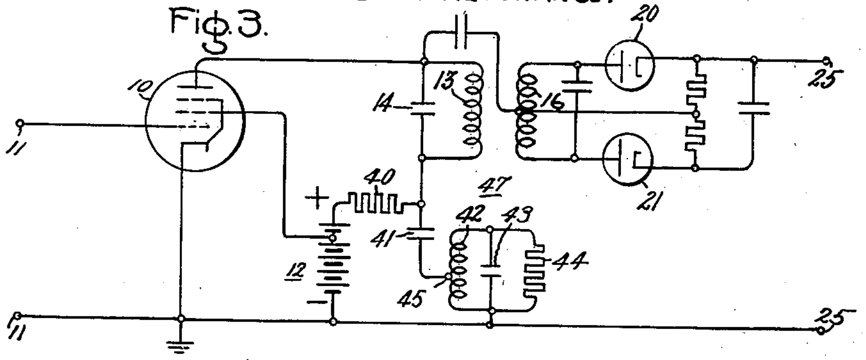
Figure 4:
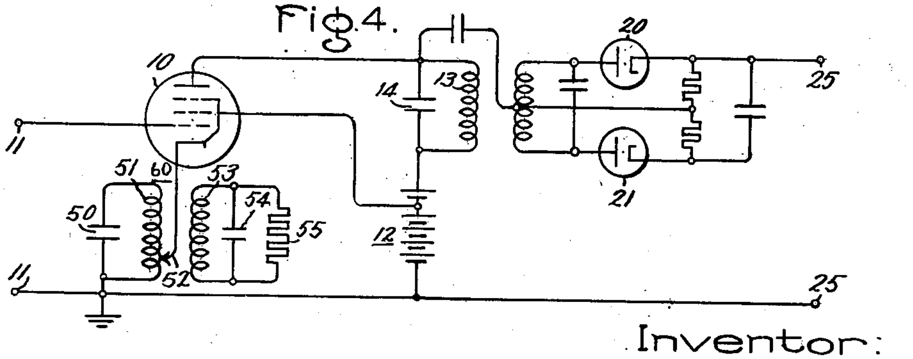

In the drawings, Fig. 1 is a schematic illustration of a circuit embodying the invention; Fig. 2 is a rectilinear co-ordinate diagram illustrating the output of the discriminator as ordinates, against frequency deviation as abcissae; and Figs. 3 and 4 are schematic illustrations of circuits embodying modified forms of the invention.

Referring now particularly to Fig. 1, there is shown a pentode valve 10 with input terminals 11 connected between grid and ground, and with its anode coupled to a discriminator. The discriminator comprises primary winding 13, secondary winding 16, diode valves 20 and 21, and output terminals 25. A battery 12 provides anode operating potential for valve 10. The primary winding 13 is tunded to the center frequency by means of a capacitance 14, and similarly, secondary winding 16 is tuned by means of a capacitance 17. A capacitance 15 provides a path for high frequency currents between the high potential end of the winding 13 and the mid-point of the secondary. The operation of the discriminator circuit is well known and has been fully described in the literature of the art, for example, in the above-cited Seeley patent, and so will not be gone into in detail. Suffice it to say that the mutual coupling between the primary and secondary windings induces in the secondary a voltage of 90° out of phase from that in the primary. The high frequency coupling through capacitance 15 introduces the voltage existent across the primary into the secondary at its mid-point. This arrangement develops voltages between ground and the two ends of the secondary which vary with frequency, and these voltages are applied to the anode of the diodes 20 and 21 so that the net output voltage is proportional to the vectorial difference between these two voltages. In this way, the output voltage varies in accordance with the frequency deviation of the wave and so, over a range of frequencies, varies in accordance with the modulation of the wave.

The circuit, as described so far, is well known, and my invention resides particularly in the circuit as modified by the insertion of the tuned circuit 30, comprising inductance 28, capacitance 27 and resistance 26, between the cathode of valve 10 and ground. The cathode is shown connected to the inductance 28 at a tap 29, which can be adjusted so as to obtain the desired degeneration.

The insertion of the tuned degenerative circuit 30 extends the linear repsonse of the discriminator over a much greater range than would be obtained if the cathode were connected directly to ground. Referring now to Fig. 2, this is illustrated by the two curves 34 and 36 illustrating respectively the output characteristic of the discriminator with a direct cathode-to-ground connection, and with the insertion of the degenerative circuit. It will be observed that the response characteristic of the discriminator is an S-shaped curve and that the useful portion thereof is the straight section on either side of the cross-over point with respect to the zero output voltage axis. In the case of the non-degenerative discriminator, having a response as illustrated by curve 34, the linear range is approximately the frequency range 35. In the case of my improved degenerative discriminator, the useful portion of its response curve 36 has been greatly increased as shown by the frequency range 37. It will be noted that in the case of curve 36 the slope of the discriminator characteristic has decreased slightly so that the efficiency of conversion of frequency deviation to amplitude modulated output is lessened somewhat. However, this is only a minor effect, and is much less than would be the case were the discriminator characteristic of curve 34 simply spread out horizontally by reducing the Q of the primary and secondary circuits.

Referring to Fig. 3, there is shown another embodiment of my invention wherein corresponding components have been labeled with the same numerals as in Fig. 1. Instead of inserting the degenerative network in the cathode circuit, it has effectively been placed in series with the primary circuit 13, 14 of the discriminator. The battery 12 has been connected to the lower side of the primary through a resistance 40. The capacitance 41 provides a carrier frequency path from the junction of resistance 40 and the lower terminal of primary 13 to a tap 45 on an inductance 42, which in combination with a capacitance 43 and a resistance 44 forms a resonant circuit 47. With this circuit, part of the output voltage is developed across resistance 40. At frequencies diverging considerably from the center frequency of the carrier, the lower side of the primary is effectively connected directly to ground through capacitance 41 and the section of inductance 42 between tap 45 and ground. However, at or near the center frequency, the degenerative circuit 47 has a high parallel impedance. Consequently, there is a considerable impedance between tap 45 and ground so that the circuit is subject to the full effect of degeneration across resistance 40. By a proper selection of the elements in the degenerative circuit 47, the linear range of the discriminator response characteristic can be extended to give results comparable with those indicated by curve 36 of Fig. 2.

Referring now to Fig. 4, there is shown yet another embodiment of my invention in which a double-tuned transformer system 60 has been substituted as a degenerative network for the simple anti-resonant circuit 30 of Fig. 1. The cathode of valve 10 is connected to a tap 52 on the primary winding 51 of the transformer 60, which is tuned by capacitance 50. A secondary circuit, comprising an inductance 53, a capacitance 54 and a resistance 55, is inductively coupled to inductance 51 to provide a double-tuned transformer. This circuit can be utilized to provide degeneration over a wider range of frequencies since the impedance curve of the primary can be given a flatter-topped characteristic.

In my invention, the degenerative circuit exerts a control on the amplitude of the output but does not affect the phase relations between currents in the primary and secondary circuits of the discriminator transformer. This is an important feature because it permits increasing the linear range of operation without unbalancing the discriminator and tends to prevent any response to amplitude modulation in the input.

While certain specific embodiments have been shown and described, it will, of course, be understood that various other modifications may be made without departing from the invention. For example, it will now be apparent to one skilled in the art that various other types of degenerative circuits may be made to fulfill the necessary requirements to obtain similar results. The appended claims are therefore intended to cover all such modifications within the true spirit and scope of the invention.

What I claim as new and desire to secure by Letters Patent of the United States is:

1. A frequency discriminator network comprising an electronic valve having input and output circuits, said input circuit being adapted to be energized from a source of frequency modulated waves, means connected to said output circuit for producing a voltage having an amplitude proportional to the deviation in frequency of said wave from a certain reference frequency, said reference frequency corresponding to a minimum voltage output point of the operating characteristic of said discriminator network, and a resonant impedance coupled to said input and output circuits and tuned to said reference frequency to provide degeneration in the gain of said network which is maximized at said reference frequency so as to extend the range over which said amplitude is proportional to said deviation.

2. A frequency discriminator network comprising an electronic valve including an anode, a cathode and a grid, said grid and a ground point constituting a pair of input terminals to which a voltage wave varying in frequency about a reference frequency is applied, said reference frequency corresponding to a minimum voltage output point of the operating characteristic of said discriminator network, a parallel-resonant circuit comprising an inductance, a capacitance and a loading resistance, said circuit being connected between said cathode and ground, a source of operating potential, and means connected between said anode and said source for translating said wave into a current whose amplitude is proportional to the frequency deviation of said wave from said reference frequency, said means comprising a transformer with primary and secondary circuits tuned to said reference frequency, a connection between said primary circuit and the mid-point of said secondary circuit, and rectifying means connected across said secondary circuit, said parallel-resonant circuit being tuned to said reference frequency, whereby the range of linear response between the magnitude of said current and the deviation of said wave is extended.

3. A frequency discriminator circuit comprising an electronic valve having an anode, a cathode and a grid, said grid and a ground point constituting a pair of input terminals to which a voltage wave varying in frequency about a reference frequency is applied, said reference frequency corresponding to a minimum voltage output point of the operating characteristic of said discriminator network, a degenerative impedance comprising a transformer with tuned primary and tuned secondary windings, said primary winding being connected between said cathode and ground and said secondary winding having a resistance connected across it, a source of operating potential, means connected between said anode and said source for translating said wave into a current whose amplitude is proportional to the frequency deviation of said wave from said reference frequency, said means comprising a transformer with primary and secondary circuits tuned to said reference frequency, a connection between said primary circuit and the mid-point of said secondary circuit, and rectifying means connected across said secondary circuit, said degenerative impedance being tuned to said reference frequency whereby the range of linear response between the magitude of said current and the deviation of said wave is extended.

4. A frequency discriminator circuit comprising an electronic valve having an anode, a cathode and a grid, said grid and said cathode constituting a pair of input terminals to which a voltage wave varying in frequency about a reference frequency is applied, said reference frequency corresponding to a minimum voltage output point of the operating characteristic of said discriminator network, a source of operating potential having a finite internal impedance, means connected between said anode and said source for translating said wave into a current whose amplitude is proportional to the frequency deviation of said wave from said reference frequency, said means comprising a transformer with primary and secondary circuits tuned to said reference frequency, a connection between said primary circuit and the midpoint of said secondary circuit, and rectifying means connected across said secondary circuit, a circuit in parallel with said source, antiresonant at said reference frequency, whereby the finite internal impedance of said source is effectively by-passed at frequencies other than said reference frequency whereby the range of linear response between the magnitude of said current and the deviation of said wave is extended.

5. The combination, in a frequency discriminator circuit, of an electron discharge device having an anode, a cathode and a control electrode, means to supply frequency modulated oscillations between said grid and said cathode, a network connected between said anode and said cathode tuned to the average frequency of said oscillations and including means to produce oscillations varying in amplitude as the frequency of said frequency modulated oscillations varies, said variation being substantially linear over a range of frequencies, and means to increase said range, said last-mentioned means comprising an impedance connected between said anode and said cathode and having a maximum impedance value at said average frequency of said frequency modulated oscillations and diminishing impedance values at frequencies departing therefrom.

6. The combination, in a frequency discriminator circuit, of an electron discharge device having an anode, a cathode and a control electrode, means to supply frequency modulated oscillations between said grid and said cathode, a network connected between said anode and said cathode tuned to the average frequency of said oscillations and including means to produce oscillations varying in amplitude as the frequency of said frequency modulated oscillations varies, said variation being substantially linear over a range of frequencies, means to increase said range, said last-mentioned means comprising an impedance connected between said anode and said cathode and having a maximum impedance value at said average frequency of said frequency modulated oscillations and diminishing impedance values at frequencies departing therefrom, and means to supply the voltage produced on said impedance to said electron discharge device in a phase to produce degeneration thereby to reduce amplification of said device at frequencies departing from said average frequency.

7. The combination, in a frequency discriminator, of an electron discharge device having an anode, a cathode, and a control electrode, a circuit between said control electrode and said cathode to supply frequency modulated oscillations to said device, a circuit between said anode and cathode including a network tuned to the average frequency of said oscillations and including means to produce oscillations varying in amplitude as the frequency of said oscillations varies, said variation being substantially linear over a range of frequencies, and means to increase said range, said last means comprising an impedance common to said circuits having maximum impedance at said average frequency and diminishing impedance at frequencies departing in either direction from said average frequency.

PAUL D. HEATH.

REFERENCES CITED

The following references are of record in the file of this patent:

UNITED STATES PATENTS

| Number | Name | Date |
|---|---|---|
| 2,242,661 | Rust | May 20, 1941 |
| 2,243,214 | Krauth | May 27, 1941 |
| 2,351,934 | De Kramolin | June 20, 1944 |
| 2,428,264 | Crosby | Sept. 30, 1947 |